United States Patent
Kittler et al.

(10) Patent No.: US 8,546,207 B2
(45) Date of Patent: Oct. 1, 2013

(54) METHOD FOR FABRICATING SEMICONDUCTOR WAFERS FOR THE INTEGRATION OF SILICON COMPONENTS WITH HEMTS, AND APPROPRIATE SEMICONDUCTOR LAYER ARRANGEMENT

(75) Inventors: Gabriel Kittler, Illmenau (DE); Ralf Lerner, Erfurt (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 0 days.

(21) Appl. No.: 13/505,101

(22) PCT Filed: Nov. 2, 2010

(86) PCT No.: PCT/EP2010/066656
§ 371 (c)(1),
(2), (4) Date: May 23, 2012

(87) PCT Pub. No.: WO2011/051500
PCT Pub. Date: May 5, 2011

(65) Prior Publication Data
US 2012/0223367 A1    Sep. 6, 2012

(30) Foreign Application Priority Data
Oct. 31, 2009  (DE) .................... 10 2009 051 521

(51) Int. Cl.
*H01L 21/338* (2006.01)

(52) U.S. Cl.
USPC ............... 438/172; 257/194; 257/E21.403; 257/E29.246

(58) Field of Classification Search
USPC ............... 438/172, 167; 257/194, E29.246, 257/E21.403, E21.407
See application file for complete search history.

(56) References Cited

U.S. PATENT DOCUMENTS

| 7,420,226 B2 | 9/2008 | Augustine et al. |
| 2004/0149202 A1 | 8/2004 | Ramdani et al. |
| 2006/0284247 A1 | 12/2006 | Augustine et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2008/0153215 A1* | 6/2008 | Sandhu et al. ............... 438/172 |
| 2010/0019279 A1* | 1/2010 | Chen et al. ................... 257/194 |

FOREIGN PATENT DOCUMENTS

| DE | 10206750 | 7/2003 |
| DE | 10219223 | 7/2003 |
| WO | 03/032397 | 4/2003 |
| WO | 2006138378 | 12/2006 |
| WO | 2008132204 | 11/2008 |
| WO | 2009011887 | 1/2009 |

* cited by examiner

*Primary Examiner* — Bilkis Jahan
(74) *Attorney, Agent, or Firm* — Hunton & Williams

(57) ABSTRACT

The invention describes a method for fabricating silicon semiconductor wafers with the layer structures from III-V semiconductor layers for the integration of HEMTs based on semiconductor III-V layers with silicon components. SOI silicon semiconductor wafers are used, the active semiconductor layer of which has the III-V semiconductor layers (24) of the HEMT design (2) placed on it stretching over two mutually insulated regions (24a, 24b) of the active silicon layer. An appropriate layer arrangement is likewise disclosed.

6 Claims, 2 Drawing Sheets

METHOD FOR FABRICATING SEMICONDUCTOR WAFERS FOR THE INTEGRATION OF SILICON COMPONENTS WITH HEMTS, AND APPROPRIATE SEMICONDUCTOR LAYER ARRANGEMENT

CROSS-REFERENCE TO RELATED APPLICATIONS

The application is a U.S. National Stage Application of International Application of PCT/EP2010/066656 filed Nov. 2, 2010, which claims benefit of German Patent Application No. 10 2009 051 521.6 filed Oct. 31, 2009, the disclosures of which are herein incorporated by reference in their entireties.

FIELD OF THE DISCLOSURE

The invention relates to semiconductor wafers comprising silicon layers and comprising structured III-V semiconductor layers, specifically group III nitride layers (for example GaN, AlN or InN), and thus to monolithic integration of silicon components comprising high electron mobility transistors (HEMTs) as III-V semiconductor components, there being the possibility of combining Si-based logic with individual specific III-V semiconductor components.

BACKGROUND OF THE DISCLOUSRE

Pure deposition or layer production of group III nitride layers on silicon wafers, in particular in a (111) orientation using buffer layers, is disclosed in DE 102 06 750 A1, DE 102 19 223 A1 and WO 2008/132204 A2. This involves deposition over the whole surface, without any structuring and without exposing the original Si surface. The major challenge of the method is to minimise the layer interlocking, based on the different lattice constants and lattice structure, by using adapted buffer layers, in such a way that there are no tears in the layers and no increase in lattice defects.

In WO 2006/138378 A1, US 2006/0284247 A1 and US 7,420,226 B2, a bonded multi-layer wafer is used to integrate the silicon CMOS technology having III-V semiconductors on a wafer. The multi-layer wafer consists of a substrate wafer of a material having high thermal conductivity (for example SiC or diamond) having continuous layers provided thereon: a monocrystalline layer (for example (111)-orientated silicon), the III-V layer thereon (for example AlGaN/GaN), a passivation layer thereon (for example of nitride), and a silicon layer thereon. In a first region CMOS transistors are provided in the silicon layer, in a second region the silicon layer is etched away, and in the lower, exposed III-V layer a high electron mobility transistor (HEMT), for example, is provided.

US 2007 0105274 A1 (or US 2007 0105335 A1 and US 2007 0105256 A1) discloses the application of further monocrystalline semiconductor layers and insulator layers to a silicon substrate wafer. This multi-layer wafer is produced by bonding. Structures are also disclosed in which different semiconductor materials are located in different regions on the surface. An example is shown in FIG. 8 thereof, in which a multi-layer wafer on the surface consists of silicon regions and of monocrystalline semiconductor regions, which are mutually separated by insulator layers or shallow trench isolations. FIG. 9 thereof illustrates a fabrication method which initially takes a multi-layer wafer as a basis for a starting wafer, subsequently provides silicon components in a front region (but only by front-end steps, i.e. process steps up to the contact plane without metallisation), subsequently etches down to a crystalline semiconductor layer in a second region, and fills the resulting depression with an epitactically grown monocrystalline semiconductor layer. The front-end process steps for structures in the monocrystalline semiconductor layer and the back-end steps (i.e. fabrication and metallisation) are carried out in succession.

FIG. 8 of US 2007 0105274 A1 discloses a prior art which is incorporated herein as FIG. 1. In terms of structure, the disclosed semiconductor arrangement consists of two regions 18 and 19 and uses a multi-layer wafer as the starting material. The first region 18 consists of a monocrystalline silicon layer 14, which is deposited over an insulation layer 13. Below the insulation layer 13 there are a monocrystalline semiconductor layer 12, consisting of a germanium and/or silicon/germanium layer, and a silicon substrate layer 11. The second region 19 consists of a second monocrystalline semiconductor layer sequence 16 and 17, which is positioned at least on part of the monocrystalline semiconductor layer 12. The two regions 18 and 19 are laterally mutually insulated by an insulation layer 15 or by shallow trench isolations (oxide, nitride or a combination thereof).

Continuous layers on substrates, for example substrates consisting of monocrystalline silicon, having different expansion coefficients or structures from the substrate, such as are used in the known method, lead to difficulties in fabricating the layer arrangement, involving the resilient interlocking of the layer arrangement and the risk of structural defects occurring in the active monocrystalline semiconductor layers, and this leads to degradation of the characteristic data, to a yield reduction and to a reduction in the reliability of the components constructed in the damaged layers, quite apart from the increased process and material cost.

SUMMARY OF THE INVENTION

There is a need to provide a method for fabricating semiconductor wafers comprising III-V layer structures for integrating HEMTs based on III-V semiconductor layers and having silicon semiconductor components and to provide appropriate layer structures, in such a way that there are advantages as regards the operation of the HEMTs, and drawbacks of the known methods are also overcome.

In a first aspect a method for fabricating at least one semiconductor wafer comprising an active silicon layer and having a structure of group III-V layers. The wafer is adapted for the integration of silicon components comprising HEMTs, which are based on group III-V layer structures. For this purpose, a substrate wafer is provided by means of which the active silicon layer is fabricated, the active silicon layer comprising a first region and a second region which are mutually electrically insulated, at least laterally, by a shallow trench isolation. A structured layer stack is further fabricated with an intermediate layer for lattice parameter adaptation, said intermediate layer being positioned on the active silicon layer of part of the first and second region and on a part between them of the shallow trench isolation, with a III-V semiconductor layer positioned above and a $III_xIII_{1-x}$-V semiconductor layer which ends the layer stack. Finally, an electrode is formed over part of the $III_xIII_{1-x}$-V semiconductor layer.

The method provides fabrication of layers on a semiconductor wafer for specific III-V semiconductor components such as HEMTs which are to be integrated, making relatively defect-free growth of a III-V semiconductor material possible on specific sub-regions of the semiconductor wafer, for example a CMOS silicon wafer. This makes possible a surface which is as planar as possible and makes electric insulation of the III-V semiconductor component from the rest of the wafer possible, at least in the lateral direction. Also, an effect or damage resulting from the silicon process steps, for example the CMOS technology or other silicon technologies, can be prevented or at least considerably reduced, both in terms of the III-V layers and in terms of damage to the silicon structures as a result of the III-V process steps.

Cost-effective fabrication can be provided with this method when wafer diameters conventional for CMOS are processed, for example 6 inches and greater. In this way, modern fabrication systems available for these wafer diameters can also be used for the fabrication process.

In a further embodiment, a source region and drain region are fabricated, also known as a source and drain. The source region is positioned over the first region of the active silicon layer and the drain region is positioned over the second region of the active silicon layer. In this way, the corresponding layers for an HEMT can be selected to be very small, since even with power transistors, part of the voltage drop may be across the semiconductor material of the first and second region, in particular on the drain side. The lateral isolation of the first and second region thus provides the desired electric strength, even in the region of the active silicon.

In a further embodiment, an electrode is formed as a gate, in such a way as to be positioned over the first region of the active silicon layer, over which the source region is also positioned. By selecting the position of the gate electrode in an adapted manner, the transistor properties, such as threshold voltage, leakage current and the like, can be set as desired, the position selected in this way being particularly adapted for relatively high-power transistors.

In a further embodiment, the active silicon layer is fabricated in such a way that a region in which silicon-based semiconductor components are fabricated is laterally delimited by isolation trenches. In this way, a desired delimitation between the III-V elements and the silicon components can be provided, and also protects the integrity of both types of component to a significant extent throughout the fabrication process.

In an advantageous embodiment, the substrate wafer is prepared in such a way that a buried insulation layer is formed below the active silicon layer, in such a way that the first and second region are delimited by the buried insulation layer and the shallow trench isolation. In this way, the III-V semiconductor elements are completely electrically isolated from the rest of the semiconductor wafer, in such a way that in this case, the advantages of III-V transistors, for example very high operating voltages, can be exploited without significantly influencing the remaining silicon regions.

In an advantageous embodiment, the layer stack is fabricated in such a way that the $III_xIII_{1-x}$-V semiconductor layer comprises aluminium, gallium and nitrogen, and the III-V semiconductor layer is a GaN layer. With this material combination, transistors in particular can be fabricated with a high power and high thermal stability.

In a further aspect, a semiconductor arrangement for monolithic integration of HEMTs is based on group III-V semiconductor layer structures and having silicon components. In this context, the semiconductor layer arrangement comprises an active silicon layer, which is formed over a substrate wafer and has a first region and a second region which is at least laterally electrically insulated therefrom. A layer stack is further provided, is formed on the surface of the active silicon layer over the first and the second region, and comprises an intermediate layer, which is positioned on the active silicon layer, a III-V semiconductor layer positioned above, and a $III_xIII_{1-x}$-V semiconductor layer thereon. An electrode is further formed on or over part of the $III_xIII_{1-x}$-V semiconductor layer.

The semiconductor layer arrangement according to the invention provides the same advantages, in terms of the fabrication and in terms of the transistor properties of the transistors fabricated from this layer structure, as were described above for the method according to the invention.

Further illustrative embodiments of the claimed invention are explained in the followed detailed description.

BRIEF DESCRIPTION OF THE DRAWINGS

The invention will now be explained in greater detail by way of embodiments, with reference to the schematic, sectional drawings, in which:

FIG. 2 is a schematic cross-section of a semiconductor arrangement 1 comprising a semiconductor substrate wafer 20 which in the example shown is provided in the form of a silicon carrier wafer 20. Further, a buried oxide layer 22 is formed on the substrate wafer 20 and an active silicon layer 24 is arranged thereover, in such a way that these components produce an SOI silicon wafer.

Figure 1:
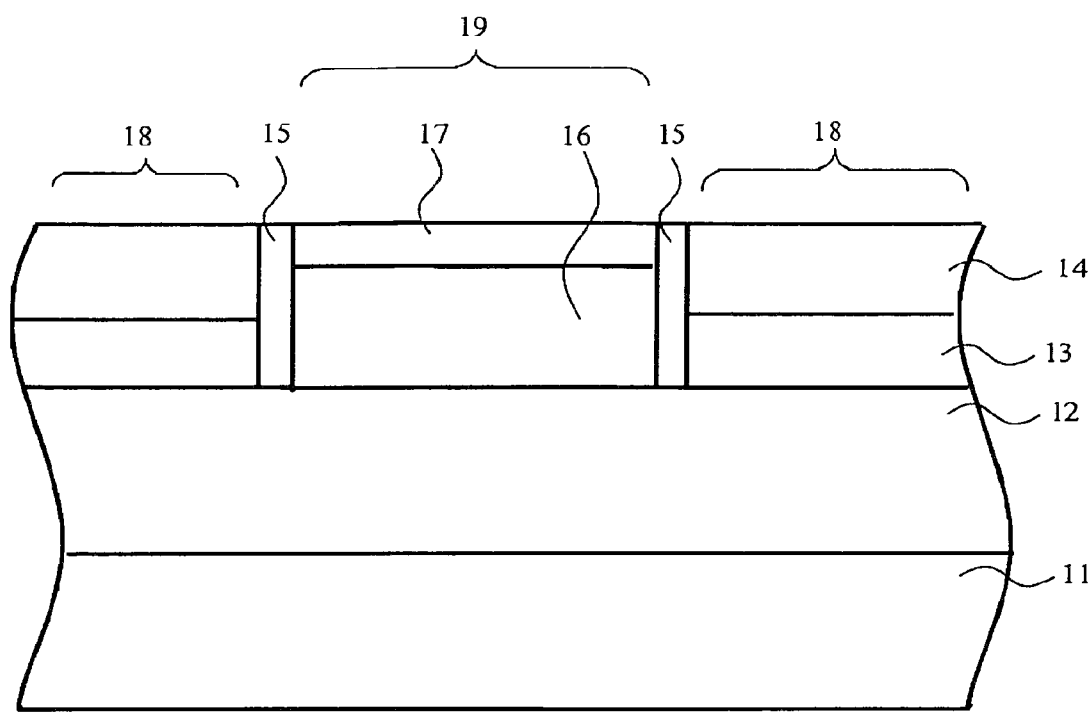
FIG. 1 is a cross-section of a layer arrangement of a semiconductor wafer according to the prior art.

In other embodiments (not shown), a bulk architecture may also be used, i.e. a construction in which the "vertical" insulation is provided by corresponding doping instead of the buried layer 22.

DETAILED DESCRIPTION OF EMBODIMENTS

In the active layer 24, individual mutually electrically insulated regions are produced in the active layer 24 by introducing a shallow trench isolation structure 26, which is to be understood as a combination of a plurality of isolation trenches 26a, 26b, 26c, some of which are interconnected.

In the example shown, a region 24c is marked in which for example silicon semiconductor elements, such as diodes and transistors, are fabricated or are to be fabricated, this being carried out using adapted technology. Processes and materials based on well-known CMOS technology can be used for this purpose, as can other silicon processing technologies.

Figure 2:
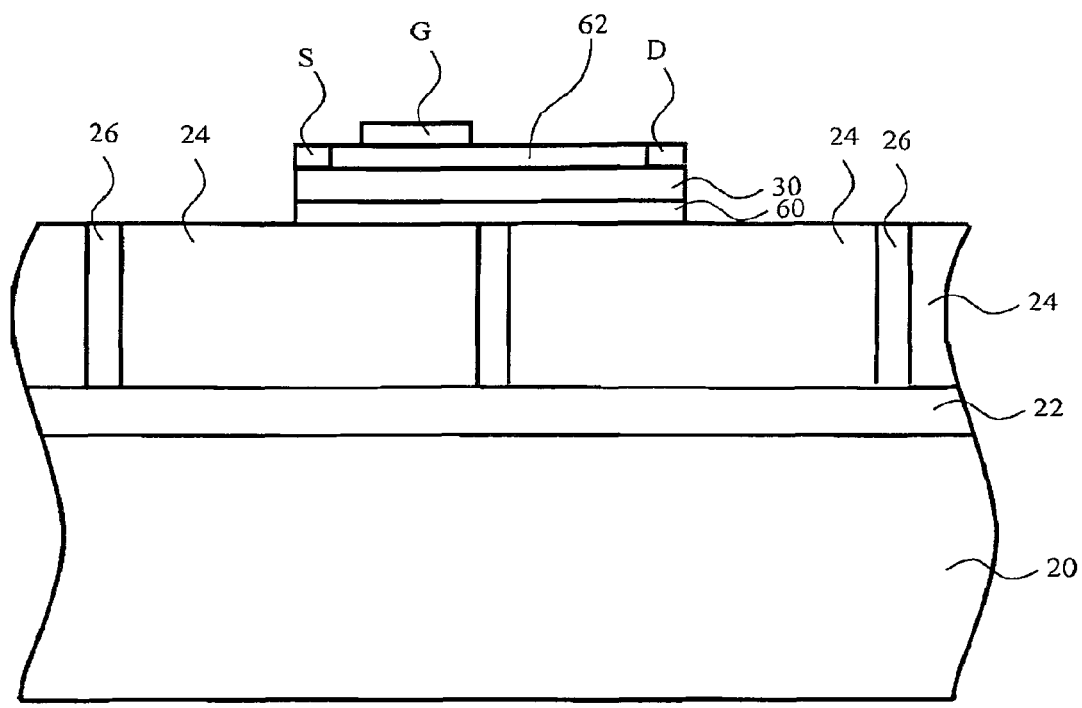
FIG. 2 is a cross-section of a layer arrangement of a first example of the semiconductor wafer according to the invention for fabricating an HEMT, based on a III-V semiconductor structure, adjacent to mutually electrically insulated regions of an active silicon layer. This also discloses an example of a method.

In the embodiment of FIG. 2, the region 24c is completely electrically insulated from other regions, i.e. the regions 24a and 24b, by corresponding regions of the shallow trench isolation 26 and by the buried insulation layer 22. In combination, the regions 24a and 24b form a region in and over which III-V semiconductor components are fabricated. However, the first region 24a is also electrically insulated from the second region 24b, in the lateral direction by a part 24c of the shallow trench isolation 26 and in the vertical direction by the buried insulation layer 22.

If appropriate, lateral and/or vertical insulation of the regions 24a, 24b may also be provided using adapted doping regions, if this is compatible with the desired transistor properties of one or more transistors which are to be fabricated in and over the regions 24a, 24b.

A layer stack 2 is produced so as to form an intermediate layer 60 for lattice parameter adaptation, a III-V semiconductor layer 30 and a $III_xIII_{1-x}$-V semiconductor layer 62 over the regions 24a, 24b and also over the part 26c of the shallow trench isolation 26, and at least one HEMT may be fabricated from this layer stack 2.

The layer stack 2 may be applied by adapted deposition and structuring methods, such as MOCVD (metalorganic chemical vapour deposition), the process parameters and the precursor gases being selected in such a way that the respective layers are obtained with the desired thickness and material composition. For example, the intermediate layer 60 is deposited as an AlGaN layer, so as to reduce the lattice differences between the silicon of the layer 24 and the following III-V semiconductor, which in an advantageous configuration is applied as GaN having a thickness of approximately (substantially) 1 μm or less, the thickness also depending on the desired properties of the transistor to be formed, which is to be fabricated from the layer stack 2.

Because the silicon material is provided in the regions 24a, 24b, the thickness of the layer 30 at a desired operating voltage for the HEMT can be reduced by comparison with conventional GaN-based HEMTs.

The "barrier layer" 62 is adjacent to the layer 30, is typically of a lower thickness than the layer 30, and is provided for example as an AlGaN layer having suitably high doping, for example n-doping.

Other layer sequences may also be used in the stack 2 if other electronic properties are required. The basic construction remains the same in terms of the position and orientation relative to the regions 24a, 24b.

In the manufacturing phase shown, the stack 2 is modified in such a way that an HEMT is fabricated therefrom. A source region S of the HEMT is positioned vertically above the insulated region 24a, and a drain region D is positioned vertically above the region 24b. The (horizontal) length of the HEMT is determined inter alia by the required breakdown voltage, i.e. by the length of the depletion region between the source S and the drain D.

As explained above, the vertical height of the III-V semiconductor layer 30 can be made very thin, since the III-V semiconductor 30 does not have to receive the entire drain voltage in the vertical direction, but the active layer 24, i.e. in particular the region 24b and to some extent also the region 24a, can take over part of the voltage stability. Further, the stack 2 comprises an electrode G which—based on adapted structuring—acts as a gate electrode for the HEMT. The electrode thus has an adapted shape for the transistor operation, in such a way that in particular a desired gate length is defined. The electrode G can be applied directly to the layer 62, or a thin insulator layer (not shown) may be provided between the electrode G and the layer 62 so as to reduce the gate leakage currents.

The gate electrode G and the drain region D and source region S can be fabricated by known methods as a Schottky contact or an ohmic contact, by applying metallisation and by heating or the like.

Because of the reduced thickness of the semiconductor layer 30, the step height of the III-V semiconductor layers, i.e. of the stack 2, is reduced considerably, and an almost planar surface can be achieved.

In an advantageous variant of the method for manufacturing silicon semiconductor wafers having group III-V layer structures for integrating silicon components having high electron mobility transistors (HEMTs) based on group III-V layer structures, the following steps are used:

An SOI silicon wafer is used having regions of the active silicon layer 24 which are mutually insulated by insulation layers 22, 26. A structured layer stack 2, formed from an intermediate layer 60 for lattice parameter adaptation, which is positioned on the active silicon layer 24, a III-V semiconductor layer 30 positioned thereover and a $III_xIII_{1-x}$-V semiconductor layer 62 (which preferably terminates the stack), is applied in such a way that this stack is positioned in an expanse according to the component size on two regions which are mutually electrically insulated by an isolation trench 26, i.e. the regions 24a, 24b, of the active semiconductor layer 24, the source and drain being formed in such a way that the source is positioned over one, the region 24a, and the drain is positioned over the other, the region 24b, of the two mutually electrically insulated regions of the active silicon layer 24. A gate is formed in such a way as to be located over the electrically insulated region of the active silicon wafer 24, over which the source is also positioned. This is all considered in a vertically aligned manner.

In an advantageous variant of the semiconductor layer arrangement for monolithic integration of HEMTs based on group III-V semiconductor layer structures and having silicon components, a layer stack 2 is provided. The layer stack 2 is formed on the surface of the active silicon layer 24 of an SOI wafer and consists of: an intermediate layer 60, which is positioned on the active silicon layer 24, a III-V semiconductor layer 30 positioned above and a $III_xIII_{1-x}$-V semiconductor layer 62. The layer stack 2 is positioned, in terms of component size, on two regions of the active semiconductor layer 24 which are mutually electrically insulated by an isolation trench 26c, for example the regions 24a, 24b. Further, the source and drain are formed in the layer stack in such a way that the source is positioned on one and the drain is positioned on the other of the two mutually electrically insulated regions of the active semiconductor layer 24, and the gate is positioned over the electrically insulated region 24a of the active silicon layer 24, over which the source S is also positioned.

We claim:

1. A method for fabricating a semiconductor wafer comprising an active silicon layer and having a structure of group III-V layers for the integration of silicon components comprising high electron mobility transistors using the structure of group III-V layers, the method comprising the steps of:

providing a substrate wafer whereon the active silicon layer, the active silicon layer comprising a first region and a second region, and having an isolation trench positioned therebetween to electrically insulate the first and second regions;

fabricating a patterned layer stack having an intermediate layer for lattice parameter adaptation and positioned on the active silicon layer over at least a part of the first region, the isolation trench, and at least a part of the second region; a III-V semiconductor layer positioned above the intermediate layer; and a $III_xIII_{1-x}$-V semiconductor layer positioned above the III-V semiconductor layer;

forming an electrode over a part of the $III_xIII_{1-x}$-V semiconductor layer; wherein the substrate wafer comprises a buried insulation layer on which the active silicon layer is formed, such that the first and second regions are delimited by the buried insulation layer and the isolation trench.

2. The method according to claim 1, wherein the active silicon layer is fabricated so that a region of said active layer is laterally isolated by a region of an insulation of the isolation trench, in which region at least one of the silicon components is fabricated.

3. The method according to claim 1, wherein the $III_xIII_{1-x}$-V semiconductor layer comprises aluminum, gallium and nitrogen, and the III-V semiconductor layer is a GaN layer.

4. The method according to claim 1, wherein the isolation trench is a shallow isolation trench.

5. The method according to claim 1, further comprising:
fabricating a source region and a drain region, the source region positioned over the first region of the active silicon layer and the drain region positioned over the second region of the active silicon layer.

6. The method according to claim 5, wherein the electrode is formed as a gate and is positioned over the first region of the active silicon layer.

* * * * *